(12) United States Patent
Leobandung

(10) Patent No.: US 9,786,566 B2
(45) Date of Patent: Oct. 10, 2017

(54) ASPECT RATIO FOR SEMICONDUCTOR ON INSULATOR

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/400,408

(22) Filed: Jan. 6, 2017

(65) Prior Publication Data

US 2017/0117194 A1    Apr. 27, 2017

Related U.S. Application Data

(63) Continuation of application No. 14/795,482, filed on Jul. 9, 2015, now Pat. No. 9,601,599, which is a (Continued)

(51) Int. Cl.
| | |
|---|---|
| H01L 21/336 | (2006.01) |
| H01L 27/088 | (2006.01) |
| H01L 21/84 | (2006.01) |
| H01L 21/762 | (2006.01) |
| H01L 21/308 | (2006.01) |
| H01L 21/311 | (2006.01) |
| H01L 21/3205 | (2006.01) |
| H01L 21/3213 | (2006.01) |
| H01L 21/8234 | (2006.01) |
| H01L 27/12 | (2006.01) |
| H01L 29/06 | (2006.01) |
| H01L 29/20 | (2006.01) |

(Continued)

(52) U.S. Cl.
CPC ........ *H01L 21/845* (2013.01); *H01L 21/3081* (2013.01); *H01L 21/31111* (2013.01); *H01L 21/32055* (2013.01); *H01L 21/32134* (2013.01); *H01L 21/76283* (2013.01); *H01L 21/823431* (2013.01); *H01L 27/1211* (2013.01); *H01L 29/0649* (2013.01); *H01L 29/20* (2013.01); *H01L 29/41791* (2013.01); *H01L 29/66795* (2013.01)

(58) Field of Classification Search
CPC ...................... H01L 29/66795; H01L 29/7831
USPC .......................... 438/283–286; 257/341, 401
See application file for complete search history.

(56) References Cited

U.S. PATENT DOCUMENTS

| | | | |
|---|---|---|---|
| 8,274,097 B2 | 9/2012 | Cheng | |
| 8,338,884 B2 | 12/2012 | Lin et al. | |

(Continued)

FOREIGN PATENT DOCUMENTS

CN    102263015 B    11/2012

OTHER PUBLICATIONS

List of IBM Patents or Patent Applications Treated as Related.

*Primary Examiner* — Calvin Lee
(74) *Attorney, Agent, or Firm* — Louis J. Percello; Ryan, Mason & Lewis, LLP

(57) ABSTRACT

A method comprises forming a first set of one or more fins in a first region from an insulated substrate and a second set of one or more fins in a second region from the insulated substrate. The insulated substrate comprises a silicon substrate, and an insulator layer deposited on the silicon substrate. The first region comprises a first material layer and the second region comprises a second material layer.

18 Claims, 5 Drawing Sheets

Related U.S. Application Data continuation of application No. 14/725,400, filed on May 29, 2015, now Pat. No. 9,536,775.

(51) Int. Cl.
*H01L 29/417* (2006.01)
*H01L 29/66* (2006.01)

(56) References Cited

U.S. PATENT DOCUMENTS

| | | |
|---|---|---|
| 8,445,334 B1 | 5/2013 | Baskar et al. |
| 8,629,045 B2 | 1/2014 | Cheng |
| 8,674,449 B2 | 3/2014 | Zhu et al. |
| 8,796,758 B2 | 8/2014 | Lin et al. |
| 9,048,219 B2 | 6/2015 | Kim et al. |
| 9,536,775 B2 * | 1/2017 | Leobandung ....... H01L 27/1211 438/263 |
| 2008/0128797 A1 | 6/2008 | Dyer et al. |
| 2010/0072515 A1 | 3/2010 | Park et al. |
| 2011/0108920 A1 | 5/2011 | Basker et al. |
| 2012/0280250 A1 | 11/2012 | Basker et al. |
| 2013/0099319 A1 | 4/2013 | Adam et al. |
| 2013/0115721 A1 | 5/2013 | Clark |
| 2013/0214357 A1 | 8/2013 | Chang et al. |
| 2013/0221491 A1 | 8/2013 | Wann et al. |
| 2014/0103394 A1 | 4/2014 | Cheng |
| 2014/0103451 A1 * | 4/2014 | Ouyang ............. H01L 21/8234 257/401 |
| 2014/0106528 A1 | 4/2014 | Quyang et al. |
| 2014/0264446 A1 | 9/2014 | Basu et al. |
| 2014/0264607 A1 | 9/2014 | Basu et al. |
| 2015/0001587 A1 | 1/2015 | Yang et al. |
| 2015/0102386 A1 | 4/2015 | Chen et al. |
| 2015/0162404 A1 | 6/2015 | Yang et al. |

* cited by examiner

100

200

300

1300

1400

ASPECT RATIO FOR SEMICONDUCTOR ON INSULATOR

FIELD

The present application relates to the field of semiconductor device manufacturing and, more particularly, to forming semiconductor on insulator.

BACKGROUND

Field effect transistors (FETs), which are considered semiconductor devices, have been used to make application specific integrated circuit (ASIC) devices, microprocessor devices, etc. Semiconductor devices can be made from various materials, for example, group IV semiconductor materials (e.g., silicon (Si)) and group III-V semiconductors materials (e.g., Germanium (Ge)). Combining the different groups of semiconductor materials in semiconductor structures provides a range of performance benefits.

SUMMARY

Embodiments of the invention provide techniques for forming semiconductors on an insulator.

For example, in one embodiment, a method comprises forming a first set of one or more fins in a first region from an insulated substrate and a second set of one or more fins in a second region from the insulated substrate. The insulated substrate comprises a silicon substrate, and an insulator layer deposited on the silicon substrate. The first region comprises a first material layer and the second region comprises a second material layer.

Advantageously, embodiments of the invention provide methods of forming fin field effect transistors (finFETS) on insulator using an Aspect Ratio Trapping (ART) technique.

These and other features, objects and advantages of the present invention will become apparent from the following detailed description of illustrative embodiments thereof, which is to be read in connection with the accompanying drawings.

DETAILED DESCRIPTION

Figure 1:
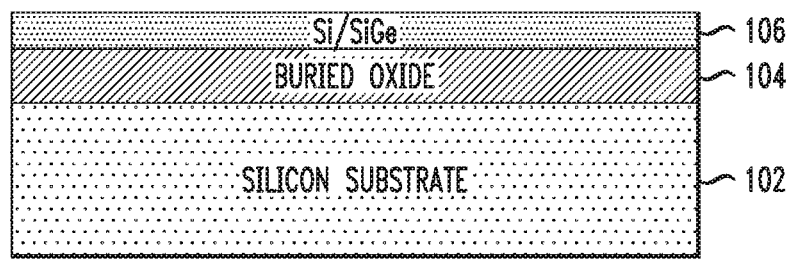
FIG. 1 illustrates a side view of a silicon substrate having an oxide layer and a silicon/silicon germanium (Si/SiGe) layer deposited thereon, according to an embodiment of the invention.

Illustrative embodiments of the invention will be described herein with reference to particular methods and apparatus. It is to be appreciated, however, that the invention is not limited to the specific methods and apparatus illustratively shown and described herein. Rather, embodiments of the invention are directed more broadly to techniques for generating finFETs on insulator. Moreover, it will become apparent to those skilled in the art given the teachings herein that numerous modifications can be made to the embodiments shown that are within the scope of the present invention. That is, no limitations with respect to the specific embodiments described herein are intended or should be inferred.

A silicon on insulator (SOI) metal-oxide-semiconductor field-effect transistor (MOSFET) is a semiconductor device in which a semiconductor layer, such as silicon or silicon germanium is formed on an insulator layer, which may be silicon dioxide and referred to as a "buried oxide layer", formed in a semiconductor substrate. SOI MOSFET devices are suitable for use in a variety of contexts, including but not limited to, computing devices, mobile devices, servers, etc. However, SOI wafer is more expensive than bulk wafer. Furthermore, growing other non-silicon semiconductors, such as group III-V semiconductors, on SOI may suffer from issues arising from lattice mismatch, a problem that arises when layering and combining various semiconductor materials. Different semiconductor materials used for forming the semiconductor structure may have varying lattice constants. Lattice mismatch occurs where two materials featuring different lattice constants are brought together by deposition of one material on top of another. Thus, when growing a semiconductor material with a second lattice constant on a semiconductor material with a first lattice constant, defects may occur, which may render the semiconductor device unusable if the defects are severe.

Various embodiments described herein use techniques for addressing and overcoming one or more of the issues arising from lattice mismatch. In some embodiments, the ART technique is utilized for addressing and overcoming one or more of the issues arising from lattice mismatch. In ART, a trench is made with a high enough aspect ratio (e.g., the ratio of the trench width to trench height) such that the defects terminate on the sidewall of the trench and any layer above the termination is defect free. The use of ART techniques for SOI devices, however, is challenging. ART uses a seed layer of a single crystal semiconductor (e.g., single crystal silicon). Thus, growing the trenches used for ART on SOI is difficult. Embodiments provide various techniques which facilitate the use of ART for SOI devices.

One or more embodiments provide for a semiconductor structure comprising finFETs on insulator formed with ART and a method of making thereof.

An illustrative embodiment for forming a semiconductor structure comprising finFET on insulator will be described below with reference to FIGS. 1-14 Each of the structures 100 to 1400 illustrate steps which may be used in the process of forming a finFET on insulator semiconductor device.

FIG. 1 is a side view, illustrating formation of the semiconductor structure 100, which includes a silicon (Si) substrate 102, a buried oxide layer 104 and a silicon or silicon germanium (Si/SiGe) layer 106. In an illustrative embodiment, the buried oxide layer 104 may have a thickness of approximately 100 nm and the Si/SiGe layer may have a thickness of approximately 50 nm. However, other suitable thicknesses may be used in alternative embodiments of the invention. In other embodiments, various other materials may be used in place of Si and Si/SiGe for layers 102 and 106, including but not limited to other group IV elements or combinations thereof.

Figure 2:
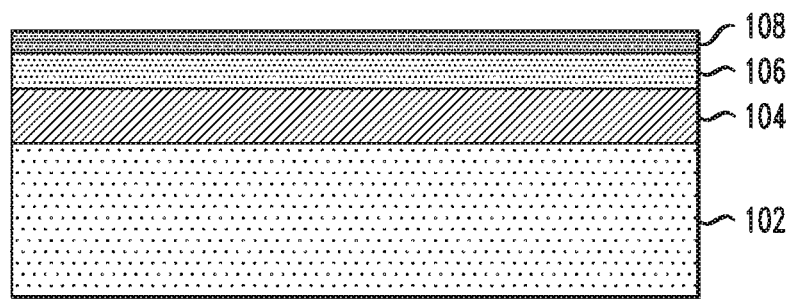
FIG. 2 illustrates a side view of the structure of FIG. 1 after a hard mask is deposited over the Si/SiGe layer, according to an embodiment of the invention.

FIG. 2 depicts a side view of the next step in forming the semiconductor device. As shown, a nitride hard mask (HM) 108 is formed over the Si/SiGe layer 106 of structure 100 resulting in structure 200. In an illustrative embodiment, the nitride HM layer 108 may have a thickness of approximately 50 nm, although other thicknesses may be contemplated. The nitride HM layer 108 may initially be formed over the entire Si/SiGe layer 106, and selectively removed in the region or regions in which one or more group III-V finFETs are to be formed. It should be noted that in other embodiments, other materials may also be used in forming the finFETs instead of group III-V compounds, e.g., other group IV material.

Figure 3:
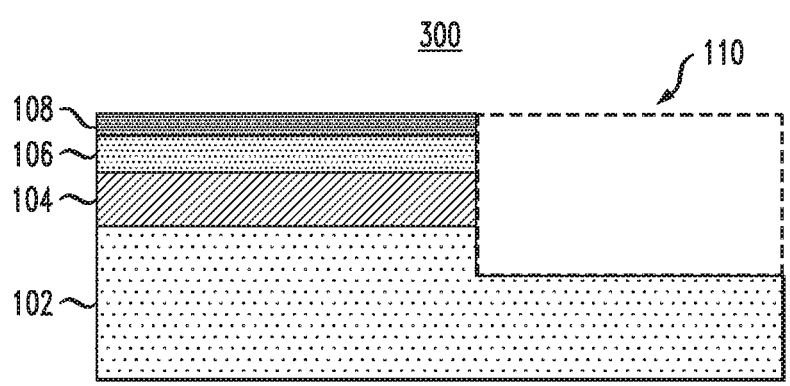
FIG. 3 illustrates a side view of the device of FIG. 2 after patterning and etching a III-V region, according to an embodiment of the invention.

As shown in FIG. 3, which depicts a side view of structure 300, the region 110 (shown in dashed lines) in which the group III-V finFETs on insulator are to be formed has been etched to a depth below the buried oxide layer 104 into Si substrate 102. This may be done by, for example, a selective etch process. In an illustrative embodiment, the depth of the etch may be from 0.5 μm to 2 μm deep from top of substrate 102, although other suitable depths may be used in alternative embodiments of the invention.

Figure 4:
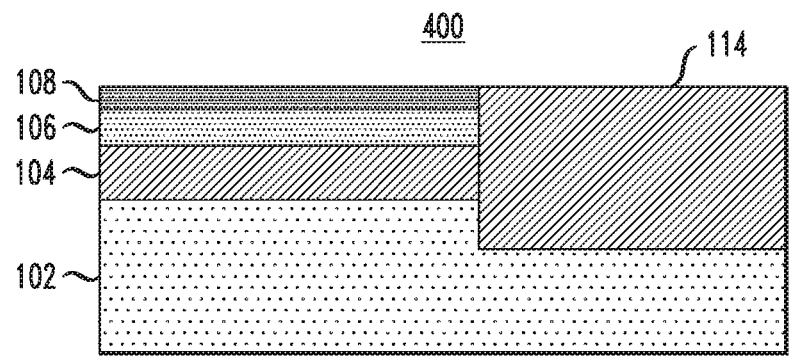
FIG. 4 illustrates a side view of the device of FIG. 3 after depositing and planarizing an oxide layer in the III-V region, according to an embodiment of the invention.

In the following step, as shown in the side view of structure 400 in FIG. 4, oxide 114 is deposited into the region 110 left open by the etch process shown in FIG. 3. Oxide 114 is then planarized to the top surface of the nitride HM 108.

Figure 5:
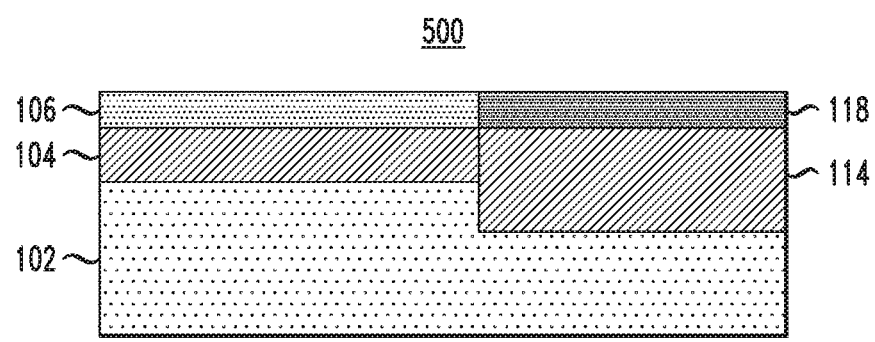
FIG. 5 illustrates a side view of the device of FIG. 4 after recessing the oxide and depositing nitride in the III-V region, according to an embodiment of the invention.

In the next step, as shown in the side view of structure 500 in FIG. 5, oxide 114 is recessed to the level of oxide layer 104. Nitride layer 108 is removed. Then a nitride layer 118 is deposited onto oxide layer 114 and planarized to the Si/SiGe layer 106.

Figure 6:
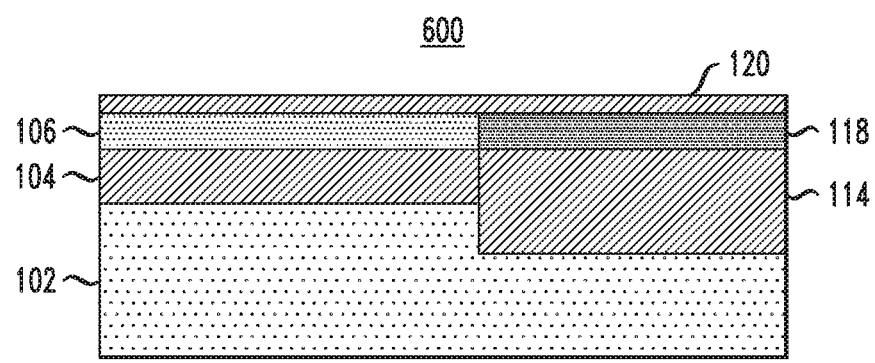
FIG. 6 illustrates a side view of the device of FIG. 5 after depositing an oxide hard mask, according to an embodiment of the invention.

Subsequently, as shown in the side view of structure 600 in FIG. 6, an oxide HM layer 120 is deposited over Si/SiGe layer 106 and nitride layer 118.

Figure 7:
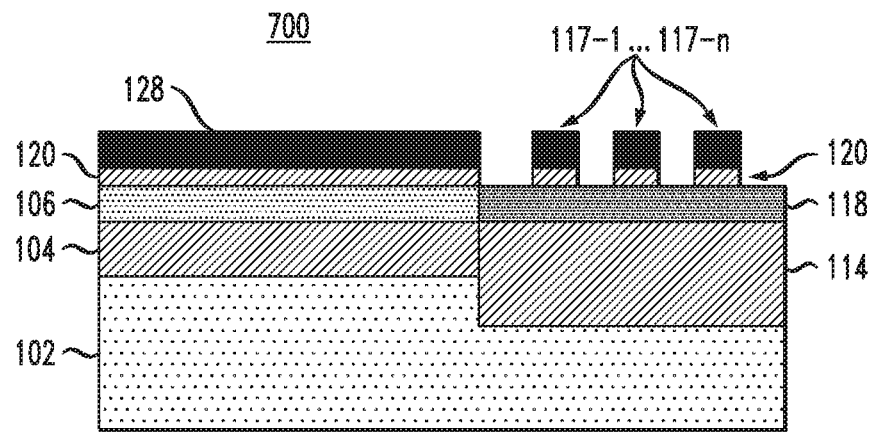
FIG. 7 illustrates a side view of the device of FIG. 6 after patterning fins on the III-V region, according to an embodiment of the invention.

FIG. 7 shows a side view of structure 700, after fins are patterned in the group III-V region. Resist mask 128 is formed on oxide HM layer 120. The resist mask 128 is patterned for fin structures, 117-1 . . . 117-n, in the group III-V region only. Each of the fin structures 117-1 . . . 117-n may be 20 nm to 40 nm in width, but other width is also applicable. Oxide HM layer 120 is etched in the group III-V region respective to the patterned resist mask 128.

Figure 8:
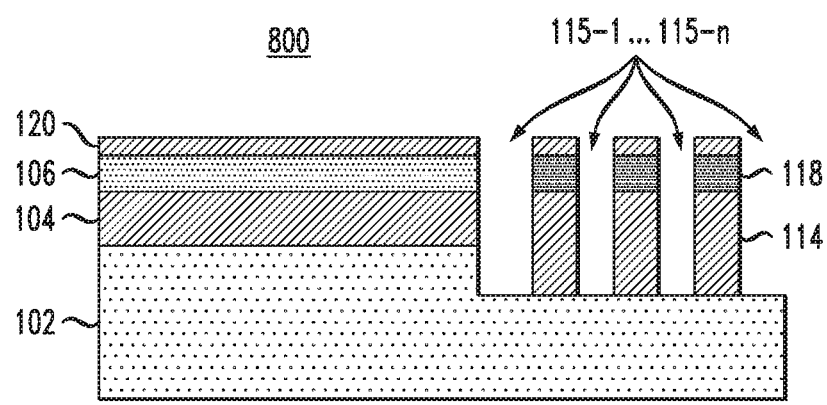
FIG. 8 illustrates a side view of the device of FIG. 7 after etching nitride and oxide in the III-V region, according to an embodiment of the invention.

FIG. 8 shows a side view of structure 800, after the etched regions of FIG. 7 are further etched to remove nitride layer 118 and oxide layer 114, thereby forming trenches 115-1 . . . 115-n. The resist mask 128 is then stripped off.

Figure 9:
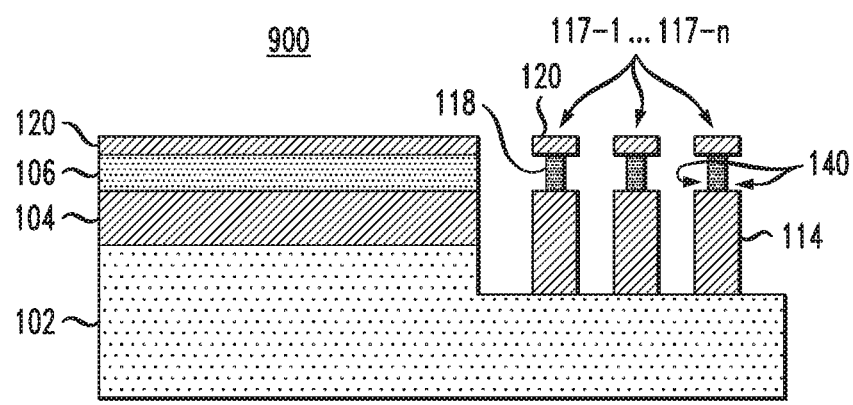
FIG. 9 illustrates a side view of the device of FIG. 8 after undercutting the nitride in each of the fins in the III-V region, according to an embodiment of the invention.

FIG. 9 shows a side view of structure 900 in which nitride layer 118 has been undercut in the regions 140 on both sides of each fin structure 117-1 . . . 117-n between oxide layers 114 and 120. Undercutting may be performed by a suitable method, such as wet etching. In an illustrative embodiment, the undercut may remove approximately 6 nm from each of the sides of the nitride layer 118. In other embodiments the undercut may remove between 2 nm and 10 nm from the nitride layer 118. The desired amount of the undercut depends on a desired size of the fin structure for a particular application.

Figure 10:
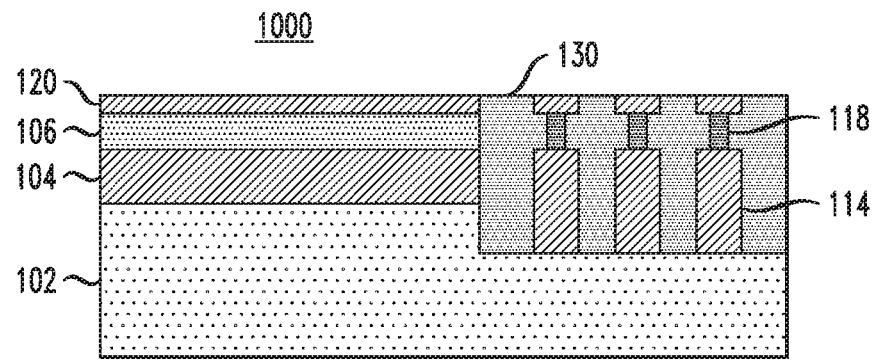
FIG. 10 illustrates a side view of the device of FIG. 9 after growth of group III-V material in the III-V region, according to an embodiment of the invention.

FIG. 10 shows aside view of structure 1000 in which group III-V material 130 is grown and fills the regions left void by the prior etching processes shown in FIGS. 8 and 9, i.e., trenches 115-1 . . . 115-n and undercut regions 140. In one embodiment, an ART technique may be used to grow the III-V material 130. The aspect ratio may be 1:3 or greater, the aspect ratio being the ratio of the trench width to trench height. In one embodiment, the group III-V material 130 may comprise indium phosphide (InP) and/or indium gallium arsenide (InGaAs). The grown group III-V material 130 is then planarized to the top surface of oxide layer 120. As mentioned before, other material such as group II-VI, or group IV can also be used.

Figure 11:
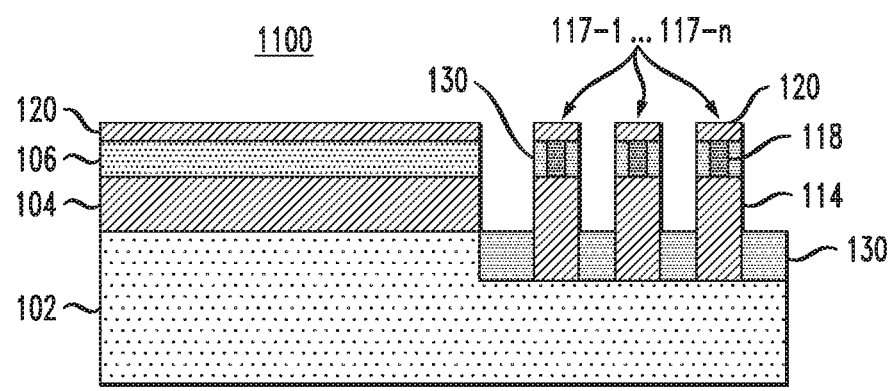
FIG. 11 illustrates a side view of the device of FIG. 10 after recessing the group III-V material, according to an embodiment of the invention.

As shown in the side view of structure 1100 in FIG. 11, following planarization, the grown group III-V material 130 is etched to recess its level to the level of the top surface of Si substrate 102. The etching process removes the group III-V material 130 in the vertical plane only, thereby leaving group III-V material 130 alongside nitride material 118 in each of the fin structures 117-1 . . . 117-n (i.e., undercut regions 140 of FIG. 9 filled in by group III-V material 130 as shown in FIG. 10).

Figure 12:
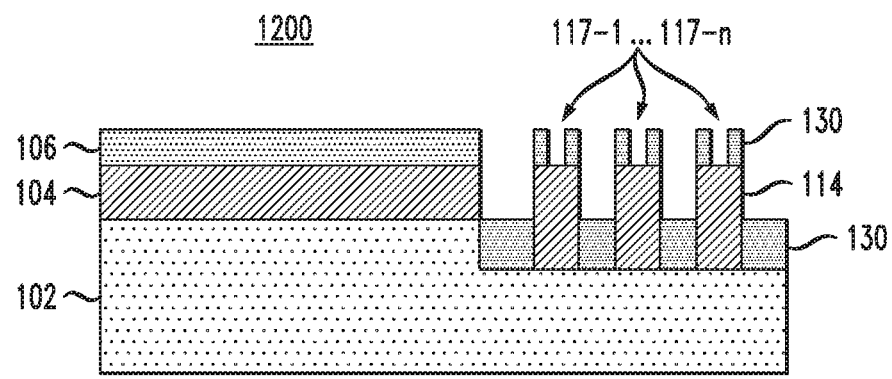
FIG. 12 illustrates a side view of the device of FIG. 11 after removing oxide and nitride from the fins in the III-V region, according to an embodiment of the invention.

FIG. 12 shows a side view of structure 1200, in which the oxide layer 120 and nitride layer 118 are removed from fin structures 117-1 . . . 117-n, leaving fin structures comprising group III-V material 130 in the III-V region.

Figure 13:
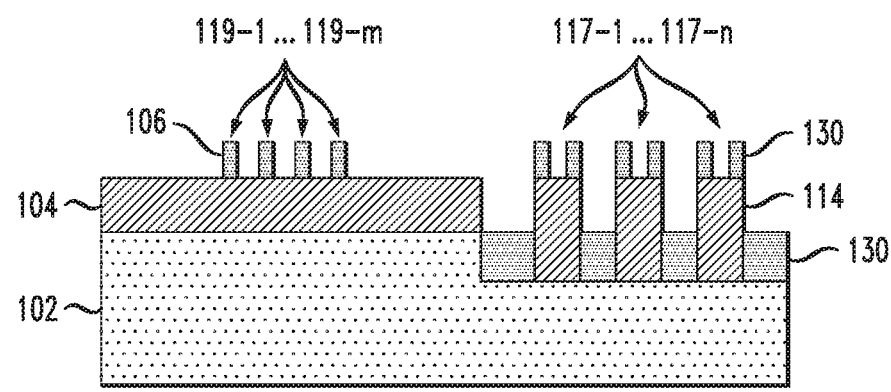
FIG. 13 illustrates a side view of the device of FIG. 12 after patterning fins outside the III-V region, according to an embodiment of the invention.

FIG. 13 shows a side view of structure 1300, in which further processing is performed using, for example, a patterned resist mask, to pattern the Si/SiGe layer 106 into fin structures 119-1 . . . 119-m.

Figure 14:
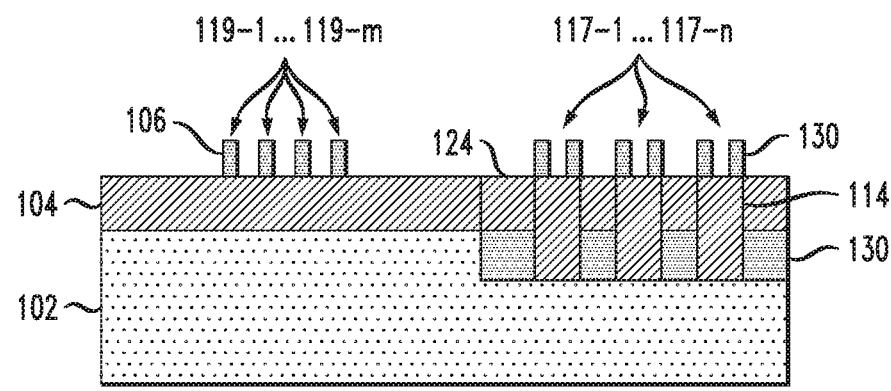
FIG. 14 illustrates a side view of the device of FIG. 13 after depositing shallow trench isolation (STI) insulator in the III-V region, according to an embodiment of the invention.

As shown in structure 1400 of FIG. 14, the spaces above the recessed III-V material 130 are deposited with a shallow trench isolation (STI) insulator 124 and then planarized to the top surface of oxide 104 and oxide 114. Suitable STI insulators may be, for example, an oxide or one or more dielectric materials such as silicon dioxide, silicon boron nitride, silicon nitride or other insulator. While not shown, the structure 1400 may be further processed to form finFETs on insulator (e.g., formation of a gate stack, source/drain regions, etc.).

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention. Although illustrative embodiments of the present invention have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method, comprising:
    forming a first set of one or more fins in a first region from an insulated substrate and a second set of one or more fins in a second region from the insulated substrate,
    wherein the insulated substrate comprises an insulator layer deposited on a silicon substrate,
    wherein the first region comprises a first material layer and the second region comprises a second material layer, and wherein forming the first set of one or more fins and the second set of one or more fins comprises:
        depositing a first hard mask layer on the second material layer;
        depositing an oxide layer on the silicon substrate in the first region; and
        planarizing the oxide layer to the first hard mask layer.

2. The method of claim 1, wherein the insulator layer is a buried oxide layer deposited on the silicon substrate in the first and second regions.

3. The method of claim 1, wherein the second material layer is comprised of a group IV material.

4. The method of claim 1, wherein the first material layer is comprised of a group III-V material.

5. The method of claim 1, further comprising etching the first region to remove the second material layer and the insulator layer, and recessing the silicon substrate to a first depth.

6. The method of claim 5, further comprising recessing the oxide layer in the first region and depositing a nitride layer thereon.

7. The method of claim 6, further comprising depositing a second hard mask layer on the silicon material layer and forming a resist mask on the second hard mask layer.

8. The method of claim 7, further comprising patterning the first set of one or more fins by etching the second hard mask layer respective to the resist mask.

9. The method of claim 8, further comprising etching the nitride and oxide layers in the first region to form one or more trenches.

10. The method of claim 9, further comprising undercutting the nitride layer in each fin of the first set of one or more fins on both sides of each fin of the first set of one or more fins, the undercut being in a range between 2 nm and 10 nm.

11. The method of claim 10, wherein the undercutting is performed using a wet-etch process.

12. The method of claim 10, further comprising growing the first material layer in the first region according to an Aspect Ratio Trapping technique.

13. The method of claim 12, further comprising recessing the first material layer to a level substantially equal to the top surface of the silicon substrate in the second region, wherein the first material layer remains proximate to the undercut nitride layer in each fin of the first set of one or more fins.

14. The method of claim 13, further comprising removing the second hard mask layer and the nitride layer from each fin of the first set of one or more fins leaving the first set of one or more fins comprising the first material layer in the first region.

15. The method of claim 14, further comprising patterning the second set of one or more fins are patterned in the second material layer.

16. The method of claim 15, further comprising depositing a shallow trench isolation (STI) insulator in the first region and planarizing the STI insulator to the insulator layer of the second region.

17. The method of claim 15, wherein the STI insulator is an oxide material.

18. The method of claim 15, the STI insulator is a material selected from the group consisting of: silicon dioxide, silicon boron nitride, and silicon nitride.

* * * * *